(12) United States Patent
Ciavatti et al.

(10) Patent No.: US 10,164,006 B1
(45) Date of Patent: Dec. 25, 2018

(54) LDMOS FINFET STRUCTURES WITH TRENCH ISOLATION IN THE DRAIN EXTENSION

(71) Applicant: GLOBALFOUNDRIES Inc., Grand Cayman (KY)

(72) Inventors: Jerome Ciavatti, Mechanicville, NY (US); Jagar Singh, Clifton Park, NY (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/797,701

(22) Filed: Oct. 30, 2017

(51) Int. Cl.
*H01L 29/66* (2006.01)
*H01L 29/06* (2006.01)
*H01L 21/02* (2006.01)

(52) U.S. Cl.
CPC .... *H01L 29/0611* (2013.01); *H01L 21/02008* (2013.01); *H01L 21/02107* (2013.01); *H01L 21/02697* (2013.01); *H01L 29/0649* (2013.01)

(58) Field of Classification Search
CPC ......... H01L 29/66681; H01L 29/66795; H01L 29/7816; H01L 29/7824
See application file for complete search history.

(56) References Cited

U.S. PATENT DOCUMENTS

| | | | |
|---|---|---|---|
| 6,876,035 B2 | 4/2005 | Abadeer et al. | |
| 7,405,443 B1 | 7/2008 | Zuniga et al. | |
| 8,716,791 B1 | 5/2014 | Iravani et al. | |
| 2003/0001198 A1 | 1/2003 | Bromberger et al. | |
| 2007/0228425 A1 | 10/2007 | Miller et al. | |
| 2008/0237702 A1* | 10/2008 | Lee | H01L 29/1083 257/336 |
| 2010/0096697 A1 | 4/2010 | Su et al. | |
| 2010/0207233 A1 | 8/2010 | Gambino et al. | |
| 2014/0015048 A1 | 1/2014 | Ng et al. | |
| 2015/0035053 A1 | 2/2015 | Singh | |
| 2018/0061981 A1 | 3/2018 | Zhou | |

OTHER PUBLICATIONS

USPTO, Office Action issued in U.S. Appl. No. 15/797,606 dated Jun. 21, 2018.
Jerome Ciavatti et al., "LDMOS FinFET Structures With Shallow Trench Isolation Inside the Fin", U.S. Appl. No. 15/797,606, filed Oct. 30, 2017.

* cited by examiner

*Primary Examiner* — Hoai V Pham
(74) *Attorney, Agent, or Firm* — Thompson Hine LLP; Anthony Canale

(57) ABSTRACT

Field-effect transistor structures for a laterally-diffused metal-oxide-semiconductor (LDMOS) device and methods of forming a LDMOS device. First and second fins are formed that extend vertically from a top surface of a substrate. A first isolation region is arranged between the first fin and the second fin. A body region of a first conductivity type is arranged partially in the substrate and partially in the second fin. A drain region of a second conductivity type is arranged partially in the substrate, partially in the first fin, and partially in the second fin. A source region is arranged within the body region in the first fin. A gate structure is arranged to overlap with a portion of the first fin. A second isolation region is arranged within the first fin, and is spaced along the first fin from the first isolation region.

20 Claims, 3 Drawing Sheets

US 10,164,006 B1

LDMOS FINFET STRUCTURES WITH TRENCH ISOLATION IN THE DRAIN EXTENSION

BACKGROUND

The present invention relates to semiconductor device fabrication and integrated circuits and, more specifically, to field-effect transistor structures for a laterally-diffused metal-oxide-semiconductor (LDMOS) device and methods of forming a LDMOS device.

Device structures for a field-effect transistor generally include a source, a drain, and a gate electrode configured to switch carrier flow in a channel formed between the source and drain during operation. When a control voltage exceeding a designated threshold voltage is applied to the gate electrode, carrier flow occurs in the channel to produce a device output current.

A fin-type field-effect transistor (FinFET) is a non-planar device structure that may be more densely packed in an integrated circuit than planar field-effect transistors. A FinFET may include a fin, a source and a drain formed in sections of the fin, and a gate electrode that wraps about a channel located in the fin body between the source and the drain. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and lowered power consumption.

High-voltage integrated circuits used, for example, in microwave/RF power amplifiers typically require specialized circuit technology capable of withstanding higher voltages. Laterally-diffused metal oxide semiconductor (LDMOS) devices are designed to handle higher voltages than logic field-effect transistors and may include features such as a an extended drain.

Improved field-effect transistor structures for a LDMOS device and methods of forming a LDMOS device are needed.

SUMMARY

In an embodiment of the invention, a structure is provided for a field-effect transistor. The structure includes first and second fins extending vertically from a top surface of a substrate, a first isolation region arranged between the first fin and the second fin, a body region that is arranged partially in the substrate and partially in the second fin, and a drain region that is arranged partially in the substrate, partially in the first fin, and partially in the second fin. The body region has a first conductivity type, and the drain region has a second conductivity type. The structure further includes a source region of the second conductivity type within the body region in the first fin and a gate structure arranged to overlap with a portion of the first fin. A second isolation region is arranged within the first fin, and is spaced along the first fin from the first isolation region.

In an embodiment of the invention, a method is provided for fabricating a field-effect transistor. The method includes forming first and second fins that extend vertically from a top surface of a substrate, forming a first isolation region arranged between the first fin and the second fin, forming a body region that is arranged partially in the substrate and partially in the first fin, and forming a drain region that is arranged partially in the substrate, partially in the first fin, and partially in the second fin. The body region has a first conductivity type, and the drain region has a second conductivity type. The method further includes forming a gate structure arranged to overlap with a portion of the first fin, and forming a source region of the second conductivity type within the first well in the first fin. A second isolation region is formed that is arranged within the first fin and that is spaced along the first fin from the first isolation region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
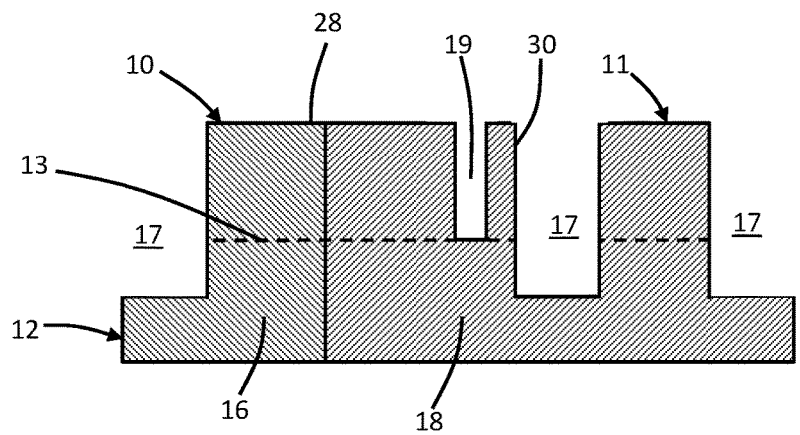
FIGS. 1-3 are cross-sectional views of a device structure at successive fabrication stages of a processing method in accordance with embodiments of the invention.

With reference to FIG. 1 and in accordance with embodiments of the invention, a fin 10 and a fin 11 each extend or project in a vertical direction from a substrate 12, such as a bulk single-crystal silicon substrate. The fins 10, 11 are three-dimensional bodies composed of a semiconductor material, such as silicon. A fin cut 19 is arranged as a trench within the fin 10. The fins 10, 11 and fin cut 19 may be formed by patterning the substrate 12 or an epitaxial layer grown on the substrate 12 using a sidewall imaging transfer (SIT) process or self-aligned double patterning (SADP) in which shallow trenches are etched into the substrate 12. The fins 10, 11 may be formed from a single fin finger that is divided into separate sections by the fin cut that is formed as one of the shallow trenches. The transition from the fins 10, 11 to the substrate 12 at the depth of the shallow trenches is indicated diagrammatically by the dashed lines in FIG. 1. The fins 10, 11 therefore adjoin the substrate 12 at its top surface 13, and have heights measured relative to the top surface 13 of the substrate 12. Deep trenches 17 are formed at the ends of the fins 10, 11 and also between the fin 10 and fin 11.

Juxtaposed wells 16, 18 are formed in the fins 10, 11 and the substrate 12. The well 16, which is located partially in the substrate 12 and partially in the fin 10, is composed of semiconductor material having an opposite conductivity type from the well 18. The well 18 is located partially in the substrate 12, partially in the fin 10, and partially in the fin 11. The well 16 may serve as a body region of the device structure, which includes a channel during device operation, and the well 18 may serve as an extended drain region of the device structure.

The well 16 may be formed by introducing a dopant by, for example, ion implantation that introduces a concentration of a dopant in the substrate 12 and fin 10. The well 18 may be formed by introducing a concentration of a different dopant of opposite conductivity type in the substrate 12 and fin 11. Respective patterned implantation masks may be used to define selected areas exposed for the implantations. The implantation mask used to select the exposed area for forming well 16 is stripped after implantation, and before the implantation mask used to form well 18 is formed. Similarly, the implantation mask used to select the exposed area for forming well 18 is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The well 16 may serve as a body region of the LDMOS device structure, which includes a channel during device operation, and the well 18 may serve as an extended drain region of the LDMOS device structure.

The implantation conditions (e.g., ion species, dose, kinetic energy) may be selected to tune the electrical and physical characteristics (e.g., electrical resistivity and depth profile) of the well 16. Similarly, the implantation conditions may be selected to tune the electrical and physical characteristics of the well 18. In an embodiment, the semiconductor material of well 16 may be doped with an n-type dopant from Group V of the Periodic Table (e.g., phosphorus (P) and/or arsenic (As)) effective to provide n-type conductivity. In an embodiment, the semiconductor material of well 18 may be doped with a p-type dopant selected from Group III of the Periodic Table (e.g., boron) effective to provide p-type conductivity.

The fin cut 19 is spaced along the length of the fin 10 from the deep trench 17 arranged between the fin 10 and the fin 11. The fin cut 19 penetrates only to the top surface 13 of the substrate 12 and stops at the top surface 13 of the substrate 12. The fin cut 19 is arranged within a portion of the well 18 that is located in the fin 10.

Figure 2:
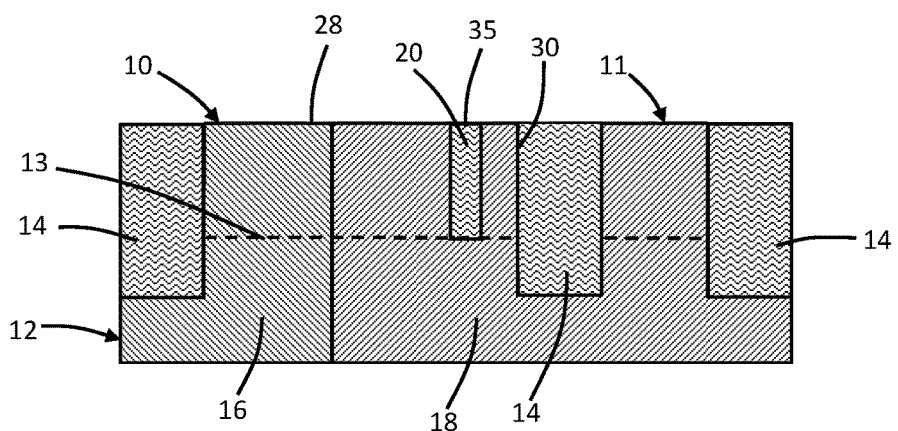

With reference to FIG. 2 in which like reference numerals refer to like features in FIG. 1 and at a subsequent fabrication stage, the shallow trenches, the deep trenches 17, and the fin cut 19 (FIG. 1) are filled with a dielectric material, such as an oxide of silicon (e.g., $SiO_2$) deposited by chemical vapor deposition (CVD), and planarized with chemical mechanical polishing (CMP) to form shallow trench isolation regions (not shown), deep trench isolation regions 14 in the deep trenches 17, and an isolation region 20 in the fin cut 19. A top surface 35 of the isolation region 20 may be coplanar with a top surface 28 of the fins 10, 11.

Figure 3:
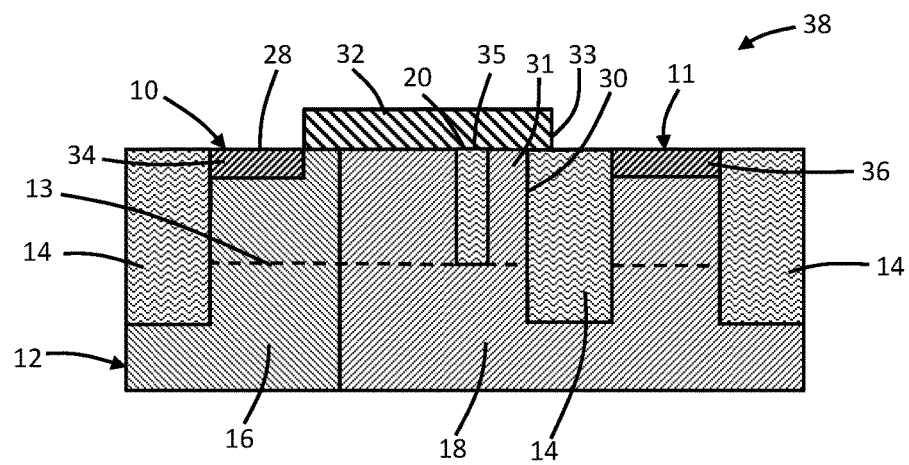

With reference to FIG. 3 in which like reference numerals refer to like features in FIG. 2 and at a subsequent fabrication stage, a gate structure 32 is formed that extends across and overlaps with the fin 10. The gate structure 32 extends onto and overlaps in part with the deep trench isolation region 14 between the fins 10, 11 and may provide electric field plating during operation. The gate structure 32 has a vertical terminating surface 33 at one of its edges that is located on the deep trench isolation region 14 arranged between the fin 10 and the fin 11.

The gate structure 32 may be formed by depositing a layer stack of different component materials and patterning the deposited layer stack with photolithography and etching. The gate structure 32 may include a gate electrode composed of a conductor, such as a metal, doped polycrystalline silicon (polysilicon), or a layered stack of these and other conductive materials, and an electrical insulator including, but not limited to, silicon dioxide ($SiO_2$), a high-k dielectric material such as hafnium oxide ($HfO_2$), or layered stacks of these and other dielectric materials. The electrical insulator is arranged between the conductor and the exterior surfaces of the fin 10. In an embodiment, the gate structure 32 may be a functional gate structure that is a permanent gate structure used to control output current (i.e., flow of carriers in the channel) of a field-effect transistor. In an embodiment, the gate structure 32 may be a sacrificial gate structure that is a placeholder structure for a functional gate structure to be subsequently formed in a replacement metal gate process.

A source region 34 and a contact region 36 of the same conductivity type are respectively formed as doped regions in the fin 10 and in the fin 11. The source region 34 is arranged in a portion of the well 16 in fin 10, and is composed of heavily-doped semiconductor material having an opposite conductivity type from the well 16. The contact region 36 is arranged in a portion of the well 18 in fin 11, and is composed of heavily-doped semiconductor material having the same conductivity type as the well 18.

The source region 34 and contact region 36 may be formed by etching the fins 10, 11 and epitaxially growing a doped semiconductor material in the respective etched volumes of the fins 10, 11, as well as ion implantation. In an embodiment in which the well 16 is n-type semiconductor material and the well 18 is p-type semiconductor material, the semiconductor material constituting the source region 34 and contact region 36 may be doped with a p-type dopant to provide p-type conductivity and may be heavily doped with the p-type dopant.

The resulting field-effect transistor 38 includes the fins 10, 11, the gate structure 32, the source region 34, a body region supplied by the well 16, and an extended drain region defined by the well 18. The top surface 28 of the fin 10 and side surface 30 of the fin 10 converge at a corner 31 of the fin 10. The isolation region 20, which is spaced inward from the side surface 30 of the fin 10, may be effective to divert current flow in the drain extension or drift region in fin 10 away from the corner. The current flow in the drain extension is constrained to flow beneath the isolation region 20 in transit from the source region 34 to the contact region 36, which distances the current flow from the corner of the fin 10 and the maximum electric fields occurring proximate to the corner during device operation.

Middle-of-line (MOL) processing and back-end-of-line (BEOL) processing follow, which includes formation of contacts and wiring for a local interconnect structure, and formation of dielectric layers, via plugs, and wiring for a BEOL interconnect structure coupled by the local interconnect structure with the field-effect transistor 38.

Figure 4:
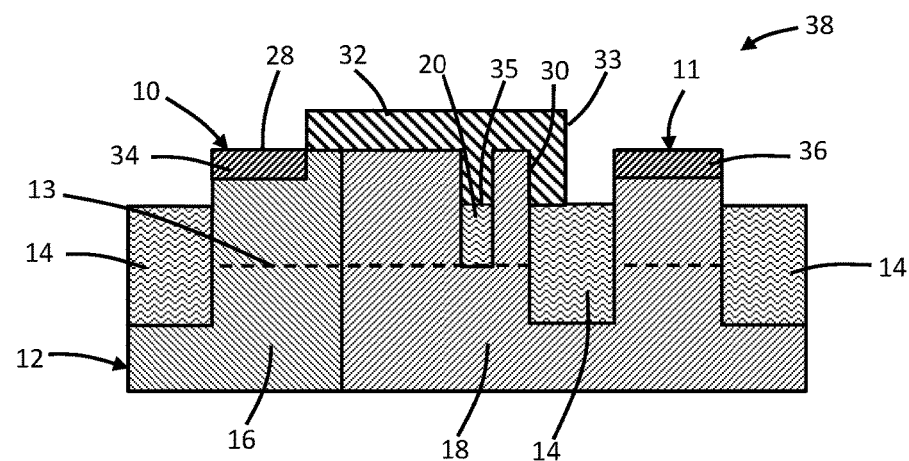
FIG. 4 is a cross-sectional view of a device structure in accordance with alternative embodiments of the invention.

With reference to FIG. 4 in which like reference numerals refer to like features in FIG. 3 and in accordance with an alternative embodiment of the invention, the top surface 35 of the isolation region 20 and the top surface 15 of the deep trench isolation regions 14 may be recessed before the gate structure 32 is formed. This is done by etching back the isolation region 20 after the dielectric material is deposited to fill the fin cut 19.

Figure 5:
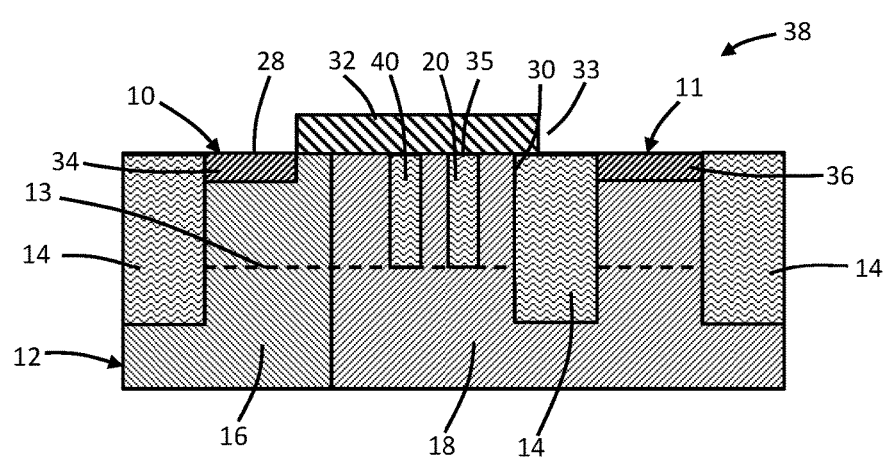
FIG. 5 is a cross-sectional view of a device structure in accordance with alternative embodiments of the invention.

With reference to FIG. 5 in which like reference numerals refer to like features in FIG. 3 and in accordance with alternative embodiments of the invention, one or more additional isolation regions 40 may be formed in the fin 10. The one or more additional isolation regions 40 may be formed in the same manner as isolation region 20, and may be spaced along the length of the fin 10 in a spaced relationship with isolation region 20 and, if more than one isolation region 40 is formed, in a spaced relationship with each other.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to or with another element if intervening elements are absent. A feature may be "indirectly connected" or "indirectly coupled" to or with another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
    a first fin and a second fin extending vertically from a top surface of a substrate;
    a first isolation region arranged between the first fin and the second fin;
    a body region that is arranged partially in the substrate and partially in the first fin, the body region having a first conductivity type;
    a drain region that is arranged partially in the substrate, partially in the first fin, and partially in the second fin, the drain region having a second conductivity type;
    a source region of the second conductivity type within the body region in the first fin;
    a gate structure arranged to overlap with a first portion of the first fin; and
    a second isolation region arranged within the first fin, the second isolation region spaced along the first fin from the first isolation region.

2. The structure of claim 1 wherein the second isolation region is arranged at and above the top surface of the substrate.

3. The structure of claim 2 wherein the first isolation region is a deep trench isolation region that extends past the top surface of the substrate and into the substrate.

4. The structure of claim 1 wherein the first fin has a top surface and a side surface that intersects the top surface of the first fin at a corner, and the second isolation region is arranged in the first fin proximate to the corner.

5. The structure of claim 4 wherein the second isolation region is arranged in the drain region in the first fin.

6. The structure of claim 1 further comprising:
    a third isolation region within the first fin, the third isolation region spaced along the first fin from the first isolation region.

7. The structure of claim 6 wherein the second isolation region and the third isolation region are arranged in the drain region in the first fin.

8. The structure of claim 1 wherein the first fin has a top surface, and the second isolation region has a top surface that is recessed within the first fin below the top surface of the first fin.

9. The structure of claim 1 wherein the first fin has a top surface, and the second isolation region has a top surface that is coplanar within the top surface of the first fin.

10. The structure of claim 1 further comprising:
    a contact region of the second conductivity type in the drain region in the second fin,
    wherein the first isolation region is arranged between the contact region and the first fin.

11. A method of fabricating a field-effect transistor, the method comprising:
    forming a first fin and a second fin that extends vertically from a top surface over a substrate;
    forming a first isolation region arranged between the first fin and the second fin;
    forming a body region that is arranged partially in the substrate and partially in the first fin, the body region having a first conductivity type;
    forming a drain region that is arranged partially in the substrate, partially in the first fin, and partially in the second fin, the drain region having a second conductivity type;
    forming a gate structure arranged to overlap with a first portion of the first fin;
    forming a source region of the second conductivity type within the body region in the first fin; and
    forming a second isolation region arranged within the first fin, the second isolation region spaced along the first fin from the first isolation region.

12. The method of claim 11 wherein the second isolation region is arranged at and above the top surface of the substrate.

13. The method of claim 12 wherein the first isolation region is a deep trench isolation region that extends past the top surface of the substrate and into the substrate.

14. The method of claim 11 wherein the first fin has a top surface and a side surface that intersects the top surface of the first fin at a corner, and the second isolation region is arranged in the first fin proximate to the corner.

15. The method of claim 14 wherein the second isolation region is arranged in the drain region in the first fin.

16. The method of claim 11 further comprising:
    forming a third isolation region within the first fin,
    wherein the third isolation region is spaced along the first fin from the first isolation region.

17. The method of claim 16 wherein the second isolation region and the third isolation region are arranged in the drain region in the first fin.

18. The method of claim 11 wherein the first fin has a top surface, and the second isolation region has a top surface that is recessed within the first fin below the top surface of the first fin.

19. The method of claim 11 wherein the first fin has a top surface, and the second isolation region has a top surface that is coplanar within the top surface of the first fin.

20. The method of claim 11 further comprising:
    forming a contact region of the second conductivity type in the drain region in the second fin,
    wherein the first isolation region is arranged between the contact region and the first fin.

\* \* \* \* \*